United States Patent
Miyata et al.

(10) Patent No.: US 7,992,069 B2
(45) Date of Patent: Aug. 2, 2011

(54) ERROR CORRECTION CODING APPARATUS AND ERROR CORRECTION DECODING APPARATUS

(75) Inventors: Yoshikuni Miyata, Tokyo (JP); Hideo Yoshida, Tokyo (JP); Kazuo Kubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1028 days.

(21) Appl. No.: 11/883,958

(22) PCT Filed: Feb. 3, 2006

(86) PCT No.: PCT/JP2006/301869
§ 371 (c)(1), (2), (4) Date: Aug. 8, 2007

(87) PCT Pub. No.: WO2006/085488
PCT Pub. Date: Aug. 17, 2006

(65) Prior Publication Data
US 2008/0148127 A1    Jun. 19, 2008

(30) Foreign Application Priority Data
Feb. 9, 2005 (JP) ................. P2005-032582

(51) Int. Cl.
*H03M 13/00* (2006.01)
(52) U.S. Cl. .................................................. 714/755
(58) Field of Classification Search ............ 714/752, 714/755, 758, 761–762, 787–788
See application file for complete search history.

(56) References Cited

U.S. PATENT DOCUMENTS

| | | | |
|---|---|---|---|
| 6,345,375 B1 * | 2/2002 | Kelkar et al. | 714/748 |
| 6,658,605 B1 | 12/2003 | Yoshida et al. | |
| 6,868,514 B2 | 3/2005 | Kubo et al. | |
| 2004/0225944 A1 * | 11/2004 | Brueggen | 714/758 |
| 2005/0229085 A1 | 10/2005 | Van Dijk et al. | |

FOREIGN PATENT DOCUMENTS

| | | |
|---|---|---|
| JP | 2001-168734 A | 6/2001 |
| JP | 2003-273841 A | 9/2003 |
| JP | 3549788 B2 | 4/2004 |
| JP | 2004-328175 A | 11/2004 |
| JP | 2005-522138 A | 7/2005 |
| WO | WO-03/085840 A1 | 3/2003 |

OTHER PUBLICATIONS

Lin, C., "Linear Block Codes," Error Control Coding. Fundamentals and Applications, Englewood Cliffs, Prentice Hall, US, 1983, pp. 51-57.

(Continued)

*Primary Examiner* — Shelly A Chase
(74) *Attorney, Agent, or Firm* — Birch, Stewart, Kolasch & Birch, LLP (57) ABSTRACT

An error correction coding apparatus divides transmission information sequences in n subframes (n is an arbitrary natural number) into n1 subframes (n1 is a natural number<n) and n2 subframes (n2 is a natural number which satisfies n1+n2=n), block-codes the n1 subframes for every m1 subframes (m1 is a factor of n1) so as to generate a first error correction code, and block-codes the n2 subframes for every m2 subframes (m2 is a factor of n2) so as to generate a second error correction code.

6 Claims, 7 Drawing Sheets

OTHER PUBLICATIONS

"Forward error correction for submarine systems", ITU-T Recommendation G.975(Oct. 2000), Series G: Transmission Systems and Media, Digital Systems and Networks, Digital sections and digital line system-Optical fibre submarine cable systems.

ITU: "Series G: Transmission Systems and Media, Digital Systems and Networks Digital sections and digital line system? Optical fibre submarine cable systems forward error correction for high bit-rate DWDM submarine systems ITU-T Recommendation G.975.1"Internet Article, Feb. 2004, XP002474600.

Tomizawa et al. "43-Gbit/s OTN Interface Prototype" Internet Article, 2000, XP002474601.

Altera: "Enhancing High-Speed Telecommunications Networks with FEC" Internet Article, Feb. 2001, XP002474602.

Simon Keeton: "Standards for optical transport demand semiconductor solutions" Internet Article, 2000, XP002474603.

Lin S et al: "Error Control Coding, Passage" Error Control Coding. Fundamentals and Applications, Englewood Cliffs, Prentice Hall, US, 1983, pp. 170-171, XP002239877.

* cited by examiner

Column Direction →

| | | | | | | |
|---|---|---|---|---|---|---|
| 0-0 | 0-1 | 0-2 | · · · | 0-12 | 0-13 | · · · |
| 1-0 | 1-1 | 1-2 | · · · | 1-12 | 1-13 | · · · |
| 2-0 | 2-1 | 2-2 | · · · | 2-12 | 2-13 | · · · |
| 3-0 | 3-1 | 3-2 | · · · | 3-12 | 3-13 | · · · |
| 4-0 | 4-1 | 4-2 | · · · | 4-12 | 4-13 | · · · |
| 5-0 | 5-1 | 5-2 | · · · | 5-12 | 5-13 | · · · |
| 6-0 | 6-1 | 6-2 | · · · | 6-12 | 6-13 | · · · |
| 7-0 | 7-1 | 7-2 | · · · | 7-12 | 7-13 | · · · |
| 8-0 | 8-1 | 8-2 | · · · | 8-12 | 8-13 | · · · |
| 9-0 | 9-1 | 9-2 | · · · | 9-12 | 9-13 | · · · |
| 10-0 | 10-1 | 10-2 | · · · | 10-12 | 10-13 | · · · |
| ⋮ | ⋮ | ⋮ | · · · | ⋮ | ⋮ | · · · |
| 126-0 | 126-1 | 126-2 | · · · | 126-12 | 126-13 | · · · |
| 127-0 | 127-1 | 127-2 | · · · | 127-12 | 127-13 | · · · |

Top ↑ ... Bottom ↓ (Row Direction)

FIG.6

Column Direction →

Top ↑

| 0-0 | 10-1 | 20-2 | ... | 120-12 | 2-13 | ... |
|---|---|---|---|---|---|---|
| 1-0 | 11-1 | 21-2 | ... | 121-12 | 3-13 | ... |
| 2-0 | 12-1 | 22-2 | ... | 122-12 | 4-13 | ... |
| 3-0 | 13-1 | 23-2 | ... | 123-12 | 5-13 | ... |
| 4-0 | 14-1 | 24-2 | ... | 124-12 | 6-13 | ... |
| 5-0 | 15-1 | 25-2 | ... | 125-12 | 7-13 | ... |
| 6-0 | 16-1 | 26-2 | ... | 126-12 | 8-13 | ... |
| 7-0 | 17-1 | 27-2 | ... | 127-12 | 9-13 | ... |
| 8-0 | 18-1 | 28-2 | ... | 0-12 | 10-13 | ... |
| 9-0 | 19-1 | 29-2 | ... | 1-12 | 11-13 | ... |
| 10-0 | 20-1 | 30-2 | ... | 1-12 | 12-13 | ... |
| ⋮ | ⋮ | ⋮ | ... | ⋮ | ⋮ | ... |
| 126-0 | 8-1 | 18-2 | ... | 118-12 | 0-13 | ... |
| 127-0 | 9-1 | 19-2 | ... | 119-12 | 1-13 | ... |

Row Direction ↓ Bottom

FIG.7

ERROR CORRECTION CODING APPARATUS AND ERROR CORRECTION DECODING APPARATUS

FIELD OF THE INVENTION

The present invention relates to an error correction coding and decoding technology. More particularly, it relates to an error correction coding/decoding method using a block code, and an error correction coding/decoding apparatus which employs the method.

BACKGROUND OF THE INVENTION

According to a prior art FEC (Forward Error Correction), the number m of bits per one symbol of an error correction code is so set up as to be equal to a factor of the parallel number n of parallel sequences to be coded at the time of the error correction coding processing (for example, nonpatent reference 1).

In general, according to such an FEC method, when the bit number m per one symbol of an error correction code is increased with the coding rate being fixed, the code length N can be lengthened and therefore the error correction capability can be improved. Therefore, in order to improve the error correction capability while a condition for selecting the bit number m per one symbol of an error correction code from the factors of the parallel number n of parallel sequences to be coded at the time of the error correction coding processing is satisfied, what is necessary is just to select, as the bit number m per one symbol of an error correction code, the largest possible factor from among the factors of n.

[Nonpatent reference 1] ITU-T recommendation G.975

However, there may be a case where it is difficult to select another factor from among the factors of n, considering the viewpoint of the circuit scale. For example, in the case of n=128, when one RS(255,239) of RS (Reed-Solomon) codes is adopted, the bit number per one symbol of an error correction code is 8, though, if 16 which is a factor of 128 and which is the second largest to 8 is selected in order to further improve the error correction capability, the circuit scale of the coding circuit for carrying out coding using a block code and that of the decoding circuit are greatly increased.

The present invention is made in order to solve the above-mentioned problem, and it is therefore an object of the present invention to construct a flexible error correction coding frame which is not influenced by constraints imposed by the frame format, thereby improving the capability of correcting random errors and burst errors.

DISCLOSURE OF THE INVENTION

In accordance with the present invention, there is provided an error correction coding apparatus which implements error correction coding for every predetermined number of frames and in a predetermined frame format, the apparatus including: a subframe division means for dividing transmission information sequences in n subframes (n is an arbitrary natural number) into n1 subframes (n1 is a natural number smaller than n) and n2 subframes (n2 is a natural number which satisfies n1+n2=n); a first error correction code generating means for block-coding the n1 subframes for every m1 subframes (m1 is a factor of n1) so as to generate a first error correction code, and for adding the generated first error correction code as redundant information; and a second error correction code generating means for block-coding the n2 subframes for every m2 subframes (m2 is a factor of n2) so as to generate a second error correction code, and for adding the generated second error correction code as redundant information.

Furthermore, in accordance with the present invention, there is provided an error correction decoding apparatus which implements error correction decoding for every predetermined number of frames and in a predetermined frame format, the apparatus including: a subframe division means for dividing received sequences in n subframes (n is an arbitrary natural number) into n1 subframes (n1 is a natural number smaller than n) and n2 subframes (n2 is a natural number which satisfies n1+n2=n); a first error correction decoding means for decoding the n1 subframes for every m1 subframes (m1 is a factor of n1) so as to output, as first estimated codeword sequences, decoded results; and a second error correction decoding means for decoding the n2 subframes for every m2 subframes (m2 is a factor of n2) so as to output, as second estimated codeword sequences, decoded results.

Thus, the error correction coding/decoding apparatus in accordance with the present invention divides transmission information sequences in n subframes (n is an arbitrary natural number) into n1 subframes and n2 subframes (n1 and n2 are natural numbers which satisfy n1+n2=n) and then carries out the error correction coding. Therefore, because the error correction coding/decoding apparatus can select the bit number per one symbol of an error correction code freely from among numbers other than the factors of n, it can improve its correcting capability while preventing its circuit scale from increasing.

PREFERRED EMBODIMENTS OF THE INVENTION

Hereafter, in order to explain this invention in greater detail, the preferred embodiments of the present invention will be described with reference to the accompanying drawings.

Embodiment 1

Figure 1:
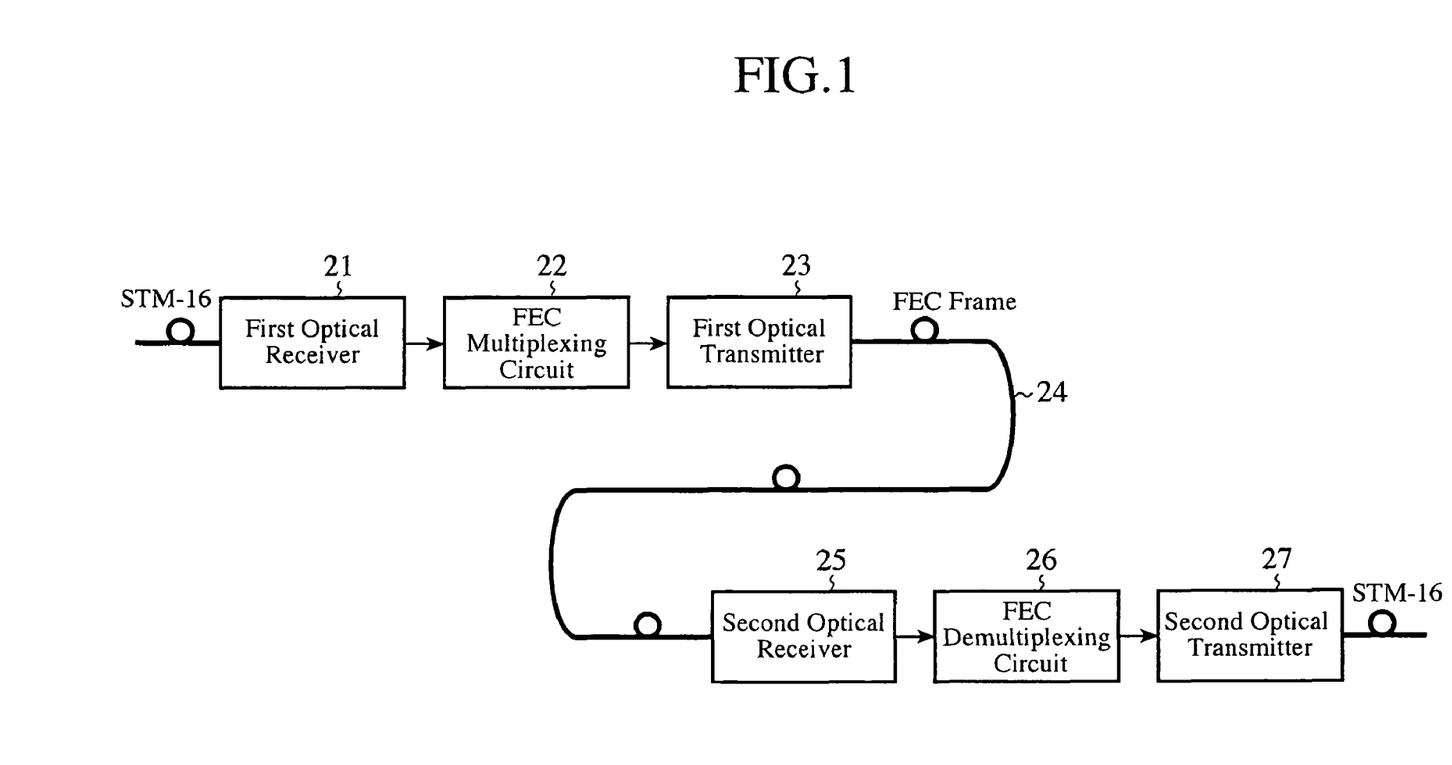
FIG. 1 is a block diagram showing the structure of error correction coding and decoding systems in accordance with embodiment 1 of the present invention.

FIG. 1 is a block diagram showing the structure of an error correction coding system and that of an error correction decoding system in accordance with embodiment 1 of the present invention. The error correction coding and decoding systems shown in the figure transmit data at the same coding rate as that defined by the ITU-T recommendation G.975 on the basis of the frame format which complies with the ITU-T recommendation G. 709 generally used by optical communications. Conventionally, an error correction code is coded for every single FEC frame. In contrast, the error correction coding/decoding system shown is characterized in that it carries out error correction coding for every two or more FEC frames In FIG. 1, a first optical receiver 21 is a circuit which receives a optical signal, such as STM-16, STM-64, or STM-256, and converts the optical signal into an electric signal, and an FEC multiplexing circuit 22 is a circuit which demultiplexes the electric signal from the first optical receiver 21, and carries out multiplexing again so as to form an FEC frame after making an insertion of overhead information, and performing error correction coding, etc. A first optical transmitter 23 is a circuit which converts the FEC frame into a optical signal, and an optical transmission line 24 is an optical transmission line via which the optical signal to which the FEC frame is converted is transmitted. A second optical receiver 25 is a circuit which converts the FEC frame transmitted thereto via the optical transmission line 24 from the optical signal into the electric signal, and an FEC demultiplexing circuit 26 is a circuit which, after carrying out demultiplexing of the electric signal from the second optical receiver 25 and processes, such as frame synchronization of the FEC frame, decoding of error correction codes, and separation of overhead information, carries out multiplexing again. A second optical transmitter 27 is a circuit which converts the electric signal from the FEC demultiplexing circuit 26 into a optical signal, such as STM-16, STM-64, or STM-256, and outputs the optical signal.

<The Detailed Structure of the FEC Multiplexing Circuit 22>

Figure 2:
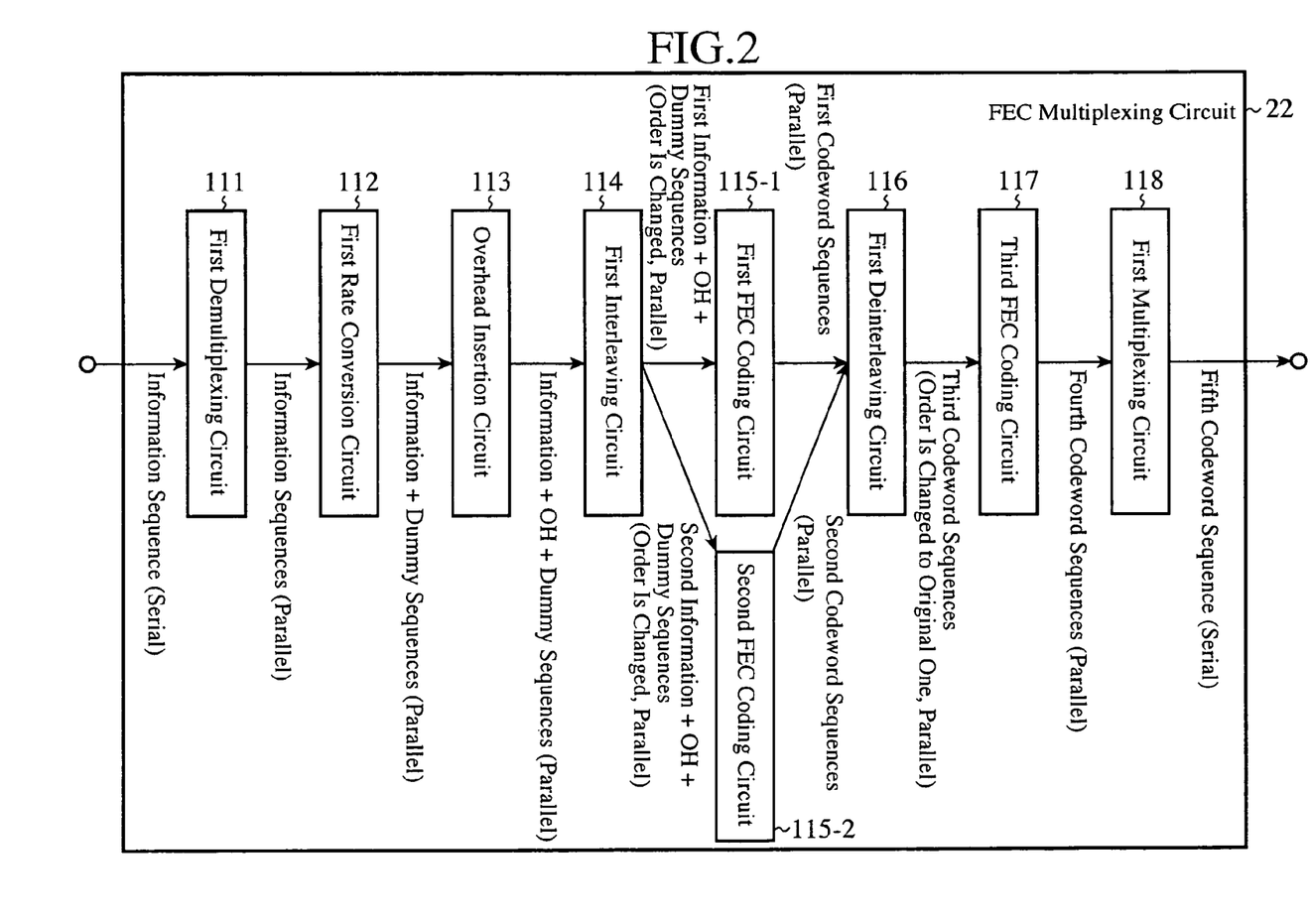
FIG. 2 is a block diagram showing the structure of an FEC multiplexing circuit in accordance with embodiment 1 of the present invention.

FIG. 2 is a block diagram showing the detailed structure of an example of the FEC multiplexing circuit 22 shown in FIG. 1. This FEC multiplexing circuit 22 serves the purpose of changing the order of pieces of information and adding two or more correcting codes so as to correct errors which cannot be corrected with a single code.

In the figure, a first demultiplexing circuit 111 is a circuit which converts a transmission information sequence inputted thereto in series from the first optical receiver 21 to parallel information sequences, and outputs them. Hereafter, an explanation will be made assuming n=128 as an example of the parallel number n of the parallel transmission information sequences.

A first rate conversion circuit 112 is a circuit which, in addition to the n parallel information sequences which the first demultiplexing circuit 111 has outputted, allocates an overhead region and a parity sequence region and adds a dummy sequence to them, and which increases the transmission rate by only a value corresponding to the size of these added redundancy regions. As a result, sequences including the input information sequences and the dummy sequence are outputted in parallel from the first rate conversion circuit 112.

An overhead insertion circuit 113 is a circuit which inserts an overhead into the overhead region included in the n parallel input information sequences and the dummy sequence which are formed by the first rate conversion circuit 112. As a result, the overhead insertion circuit 113 outputs in parallel sequences including the input information sequences, the overhead, and the dummy sequence.

A first interleaving circuit 114 is an example of a subframe division means described in claim 1, and is a circuit which divides the sequences including the input information sequences, the overhead, and the dummy sequence, which the overhead insertion circuit 113 has outputted, into n1 parallel sequences and n2 parallel sequences, and then outputs them to a first FEC coding circuit 115-1 and a second FEC coding circuit 115-2, which will be mentioned below, respectively. In this case, n1 and n2 are natural numbers which satisfy n=n1+n2.

The first FEC coding circuit 115-1 is an example of a first error correction coding means described in claim 1, and is a circuit which performs error correction coding on the sequences inputted thereto with a block code on a Galois field $GF(2^{m1})$ (where m1 is a factor of n1), the block code having a predetermined code length $N_R$ and an information length $K_R$. As a result, n1 first codeword sequences are outputted in parallel from the first FEC coding circuit 115-1.

The second FEC coding circuit 115-2 is an example of a second error correction coding means described in claim 1, and is a circuit which performs error correction coding on the sequences inputted thereto with a block code on a Galois field $GF(2^{m2})$ (where m2 is a factor of n2), the block code having the predetermined code length $N_R$ and the information length $K_R$. As a result, n2 second codeword sequences are outputted in parallel from the second FEC coding circuit 115-2.

A first deinterleaving circuit 116 is a circuit which combines the n1 parallel first codeword sequences outputted from the first FEC coding circuit 115-1 and the n2 parallel second codeword sequences outputted from the second FEC coding circuit 115-2 into n parallel codeword sequences, and which changes the order of the n parallel codeword sequences so that they have the same order as the parallel sequences inputted to the first interleaving circuit 114 and then outputs the result of the changing as third codeword sequences.

A third FEC coding circuit 117 is a circuit which divides the n parallel third codeword sequences outputted by the first deinterleaving circuit 116 into groups each of which is a unit of $n_b$ parallel lines in a vertical direction and $N_B$ time slices in a horizontal direction, and which carries out coding for every group with a second block code in which an element on a Galois field $GF(2^{mb})$, the element having a code length $N_B \times n_b/m_b$ and an information length $K_B \times n_b/m_b$, is defined as a code symbol. As a result, fourth codeword sequences are outputted in parallel.

A first multiplexing circuit 118 is a circuit which converts the parallel fourth codeword sequences outputted from the third FEC coding circuit 117 into a serial fifth codeword sequence, and which outputs the serial fifth codeword sequence to the first optical transmitter 23.

Information (data) transmitted between circuits (components arranged between the first demultiplexing circuit 111 and the first multiplexing circuit 118) which are components of the FEC multiplexing circuit 22 can be sent by using a pipeline method of transmitting data via a bus which connects between the circuits, or by disposing a working storage area which can be referred to by two adjacent circuits at forward and backward stages of the working storage area. Hereinafter, in order to facilitate the understanding of this embodiment, an explanation will be made assuming that a working storage area which can be referred to by two adjacent circuits at forward and backward stages of the working storage area is disposed to enable information to be transmitted between them.

Figure 3:
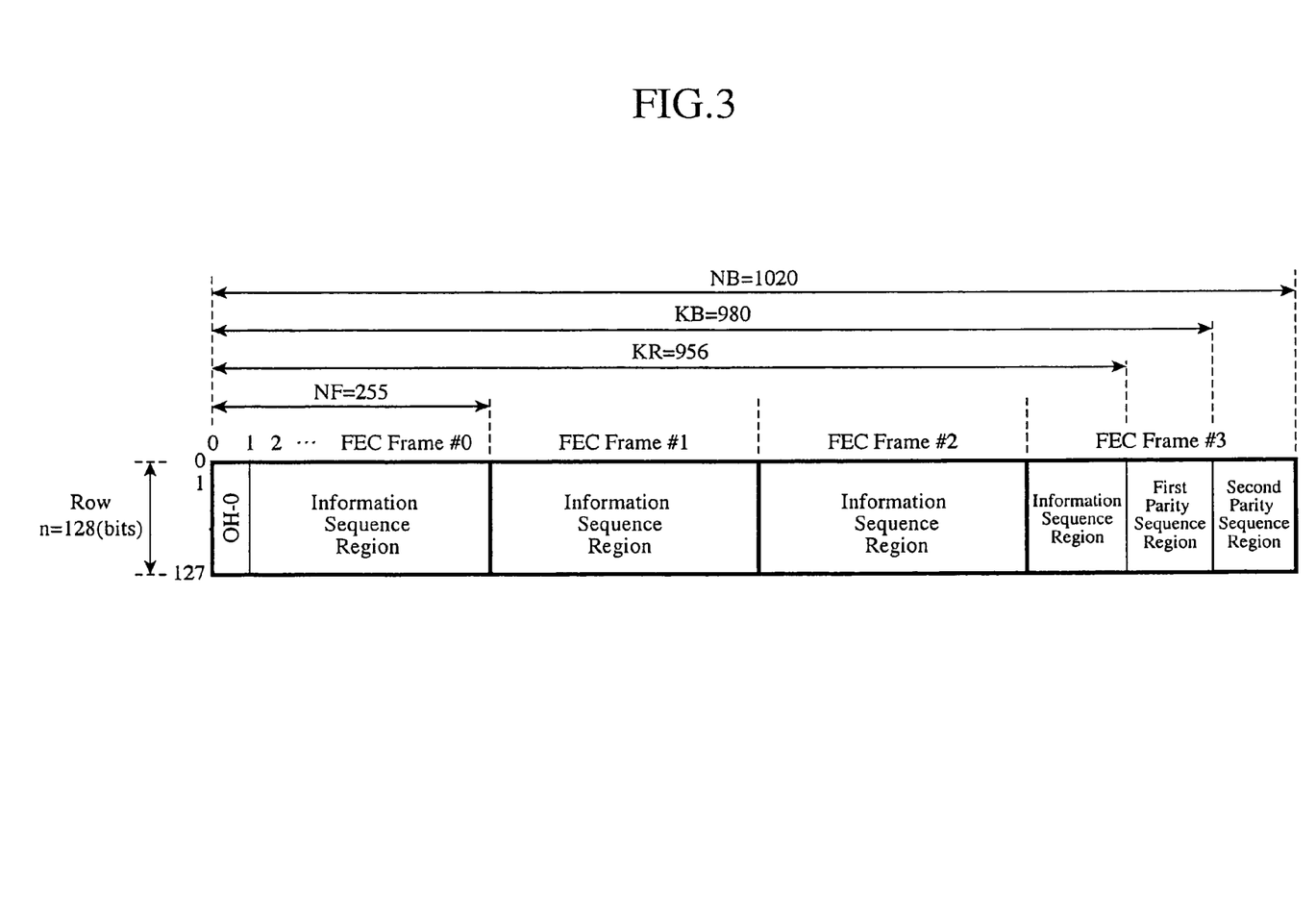
FIG. 3 is a block diagram showing the structure of a working storage area in accordance with embodiment 1 of the present invention.

Next, the structure of such a working storage area will be explained. FIG. 3 is a block diagram of a working storage area in a case in which four single FEC frames are combined (this combination is referred to as an OTU frame), and transmission control and frame synchronization control are performed collectively on the combined FEC frames. This combined FEC frames are called an OTUk frame, where an integer: 1, 2, or 3 is assigned to k according to the transmission rate. For the sake of simplicity, k will be omitted from the following explanation. The working storage area shown in FIG. 3 is referred to as an OTU frame buffer for the sake of convenience.

In the OTU frame buffer shown in FIG. 3, pieces of information are stored in the direction from top to bottom in such a manner that the destination in which information is to be stored for the next time is shifted row by row in the direction from top to bottom and column by column in the rightward direction within a box of n-bit (n=128) height and $N_B$-bit ($N_B$=1,020) width. Furthermore, the 0th column of the frame buffer is an overhead region to which the overhead of the FEC frame #0 is assigned. In addition, the 1st through $K_R-1$(=955)th columns are information sequence regions to which inputted binary transmission information sequences are assigned. The $K_R$(=956)th through $K_B-1$(=979)th columns are a first parity sequence region to which parity symbols generated during the first and second FEC coding processes are assigned, and the $K_B$(=980)th through $N_B-1$(=1,019)th columns are a second parity sequence region to which parity symbols generated during the third FEC coding process are assigned. Although not shown in the figure, the overhead regions of the FEC frames #1 to #3 are included in the information sequence regions, respectively.

The detailed structure of the FEC multiplexing circuit 22 is shown as above.

<The Detailed Structure of the FEC Demultiplexing Circuit 26>

Figure 4:
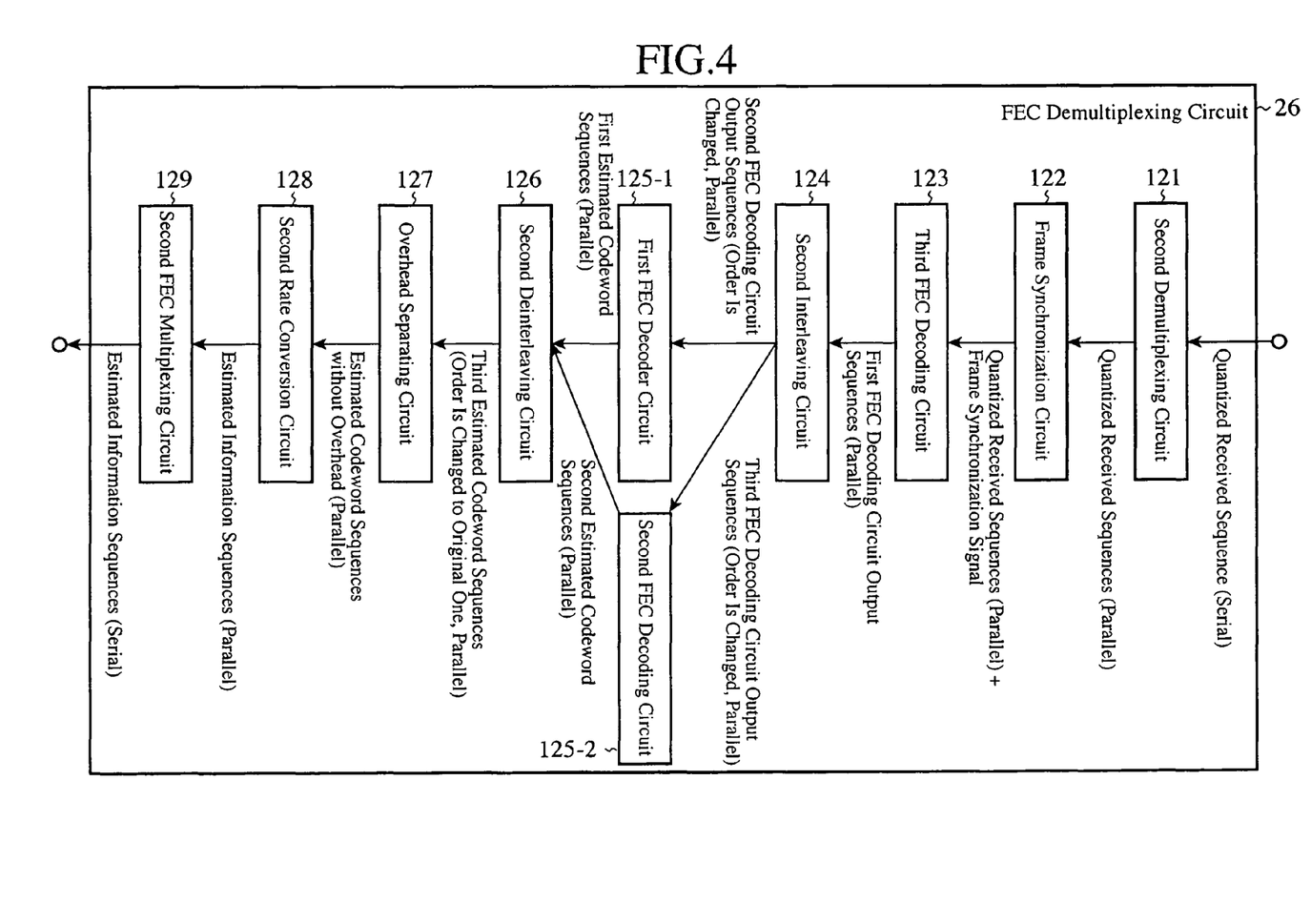
FIG. 4 is a block diagram showing the structure of an FEC demultiplexing circuit in accordance with embodiment 1 of the present invention.

Next, the detailed structure of the FEC demultiplexing circuit 26 will be explained. This demultiplexing circuit corresponds to the FEC multiplexing coding circuit 22, and has a capability of independently and respectively decoding the two or more types of error correction codes which the FEC multiplexing coding circuit 22 has added. The demultiplexing circuit is thus so constructed as to be able to correct an error which cannot be corrected only by decoding an independent error correction code.

FIG. 4 is a block diagram showing the detailed structure of the FEC demultiplexing circuit 26. The receive side demodulates and analog-to-digital converts a received sequence in series into which noise is mixed when passing through the optical communication path so as to generate a quantized received sequence. Hereafter, assume that the receive side carries out the quantization in units of q bits per symbol transmitted. Furthermore, a case of q=1 is referred to as hard decision and a case of q>1 is referred to as soft decision.

A second demultiplexing circuit 121 is a circuit which converts the quantized received sequence into n' (n'=n×q) parallel quantized received sequences. In the quantized received sequences having q bits per symbol transmitted, because each q-bit set can be dealt with as a unit, the n' parallel quantized received sequences will be referred to as "n parallel sequences" in the following explanation of the receive side.

A frame synchronization circuit 122 is a circuit which detects the overhead information added to the n parallel quantized received sequences, and determines the top position of the frame.

A third FEC decoding circuit 123 is a circuit which performs a decoding process (a decoding process of the correcting code coded by the third FEC coding circuit 117) associated with the fourth codeword sequences on the n parallel quantized received sequences which are outputted by the frame synchronization circuit by adding a frame synchronization signal to the n parallel quantized received sequences. As a result, first FEC decoding circuit output sequences are outputted in parallel.

A second interleaving circuit 124 is an example of a sub-frame division means described in claim 4, and is a circuit which divides and outputs the first FEC decoding circuit output sequences inputted thereto in parallel to a first FEC decoding circuit 125-1 and a second FEC decoding circuit 125-2 which are disposed therebehind. As a result, first codeword sequences whose parallel number is n1 and which are outputted by the first FEC coding circuit 115-1 are inputted, as second FEC decoding circuit output sequences, to the first FEC decoding circuit 125-1. Furthermore, second codeword sequences whose parallel number is n2 and which are outputted by the second FEC coding circuit 115-2 are inputted, as third FEC decoding circuit output sequences, to the second FEC decoding circuit 125-2.

The first FEC decoding circuit 125-1 is an example of a first error correction decoding means described in claim 4, and is a circuit which decodes the error correction code which is coded by the first FEC coding circuit 115-1 and outputs a first estimated codeword sequence.

The second FEC decoding circuit 125-2 is an example of a second error correction decoding means described in claim 4, and is a circuit which decodes the error correction code which is coded by the second FEC coding circuit 115-2 and outputs a second estimated codeword sequence.

A second deinterleaving circuit 126 is a circuit which combines the first estimated codeword sequence and the second estimated codeword sequence which are respectively outputted by the first FEC decoding circuit 125-1 and the second FEC decoding circuit 125-2, and reconstructs them so that they are arranged in the order that they have been inputted to the second interleaving circuit 124, and outputs them as n parallel third estimated codeword sequences.

An overhead dividing circuit 127 is a circuit which removes a bit corresponding to the overhead signal from the estimated codeword sequences outputted from the second deinterleaving circuit 126. As a result, the estimated codeword sequences from which the overhead signal is removed are outputted in parallel.

A second rate conversion circuit 128 is a circuit which separates and removes a bit corresponding to the parity sequence region allocated by the first rate conversion circuit 112 on the transmit side, and performs an inverse rate conversion on the n parallel sequences. As a result, estimated information sequences are outputted in parallel.

A second multiplexing circuit 129 is a circuit which converts the parallel estimated information sequences into a serial estimated information sequence, and outputs it to the second optical transmitter 27.

Information (data) transmitted between components disposed in the FEC demultiplexing circuit 26 can be transferred by using a bus based on a pipelined architecture, as in the case of the FEC multiplexing circuit 22, or can be transferred by using an OTU frame buffer as shown in FIG. 3. Hereinafter, in order to facilitate the understanding of this embodiment, an explanation will be made assuming that a method of using an OTU frame buffer is adopted. The detailed structure of the FEC demultiplexing circuit 26 is shown as above.

<The Operation of the Transmit Side>

Next, the operation of the error correction coding/decoding system in accordance with embodiment 1 of the present invention will be explained with reference to figures. The electric signal into which the optical signal is converted by the first optical receiver 21 is inputted serially to the FEC multiplexing circuit 22, and is further converted into n (n=128)

parallel information sequences by the first demultiplexing circuit 111. The first rate conversion circuit 112 carries out a rate conversion ($N_B/(K_R-f)$ times) which corresponds to the overhead region and the first and second parity sequence regions on the basis of the n parallel information sequences. In this case, f is the number of FEC frames included in the OTU frame, and is set to f=4.

This rate conversion process is a process of expanding the n parallel information sequences inputted thereto into information sequence regions as shown in FIG. 3, allocating an overhead region, a first parity sequence region which is used to store the parity symbols of first and second error correction codes, and a second parity sequence region whish is used to store the parity symbol of a third error correction code is stored, and increasing the output rate. In this case, dummy data (for example, zero) is inserted into each of the overhead region, and the first and second parity sequence regions.

After that, the overhead insertion circuit 113 inserts an overhead into the overhead region. The overhead consists of signals required for frame synchronization, transmission control, etc.

The first interleaving circuit 114 divides the sequences which consist of the input information sequences, the overhead, and the dummy sequences which the overhead insertion circuit 113 has outputted into two portions and outputs them to the first FEC coding circuit 115-1 and the second FEC coding circuit 115-2, respectively. When dividing the n parallel transmission information sequences, the first interleaving circuit 114 divides them after changing the order of the pieces of information included in these information sequences. Next, a concrete example of a method of changing the order of the pieces of information included in the information sequences will be explained with reference to a figure.

Figure 5:
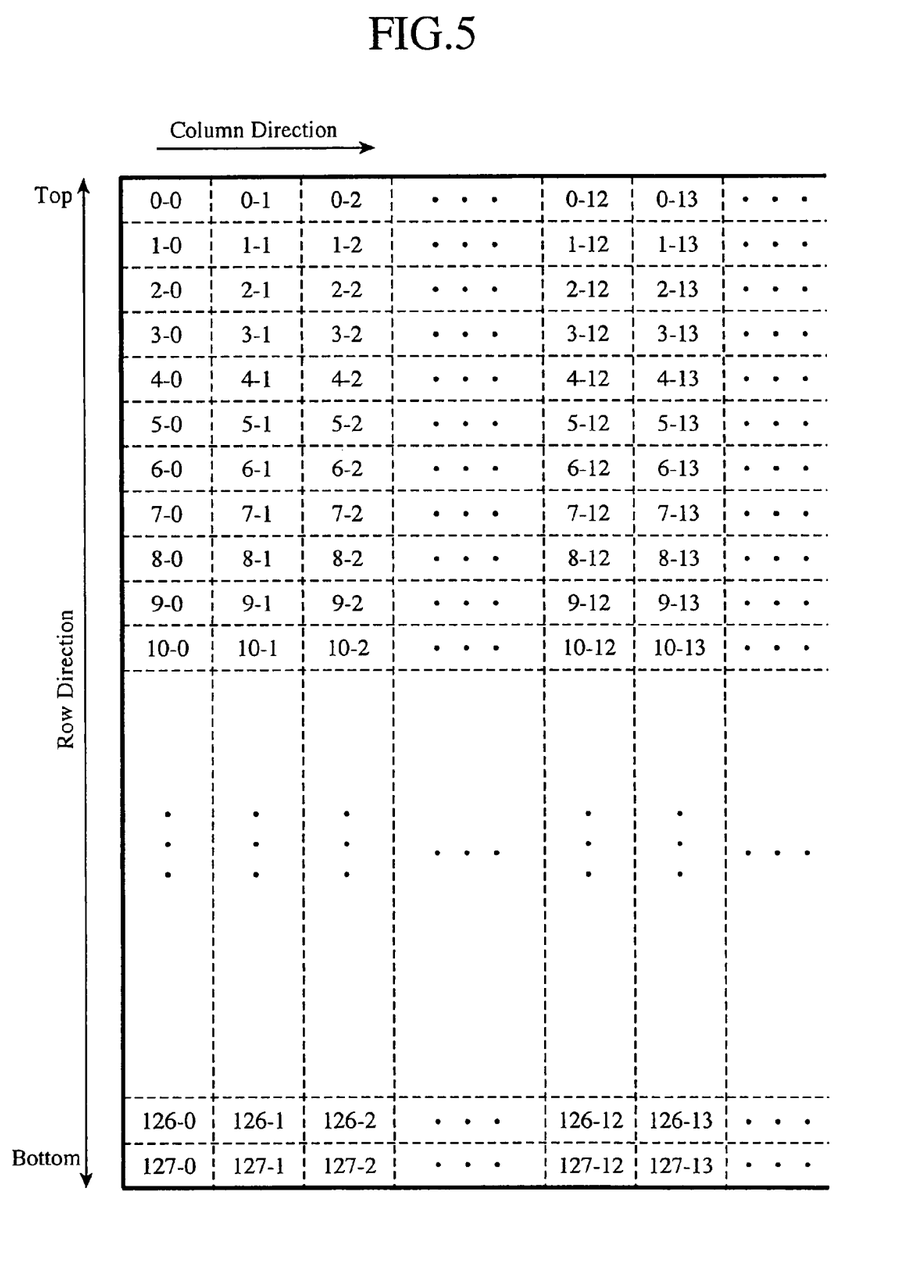
FIG. 5 is a diagram showing the order of pieces of information in a transmission information sequence in accordance with embodiment 1 of the present invention.
Figure 6:
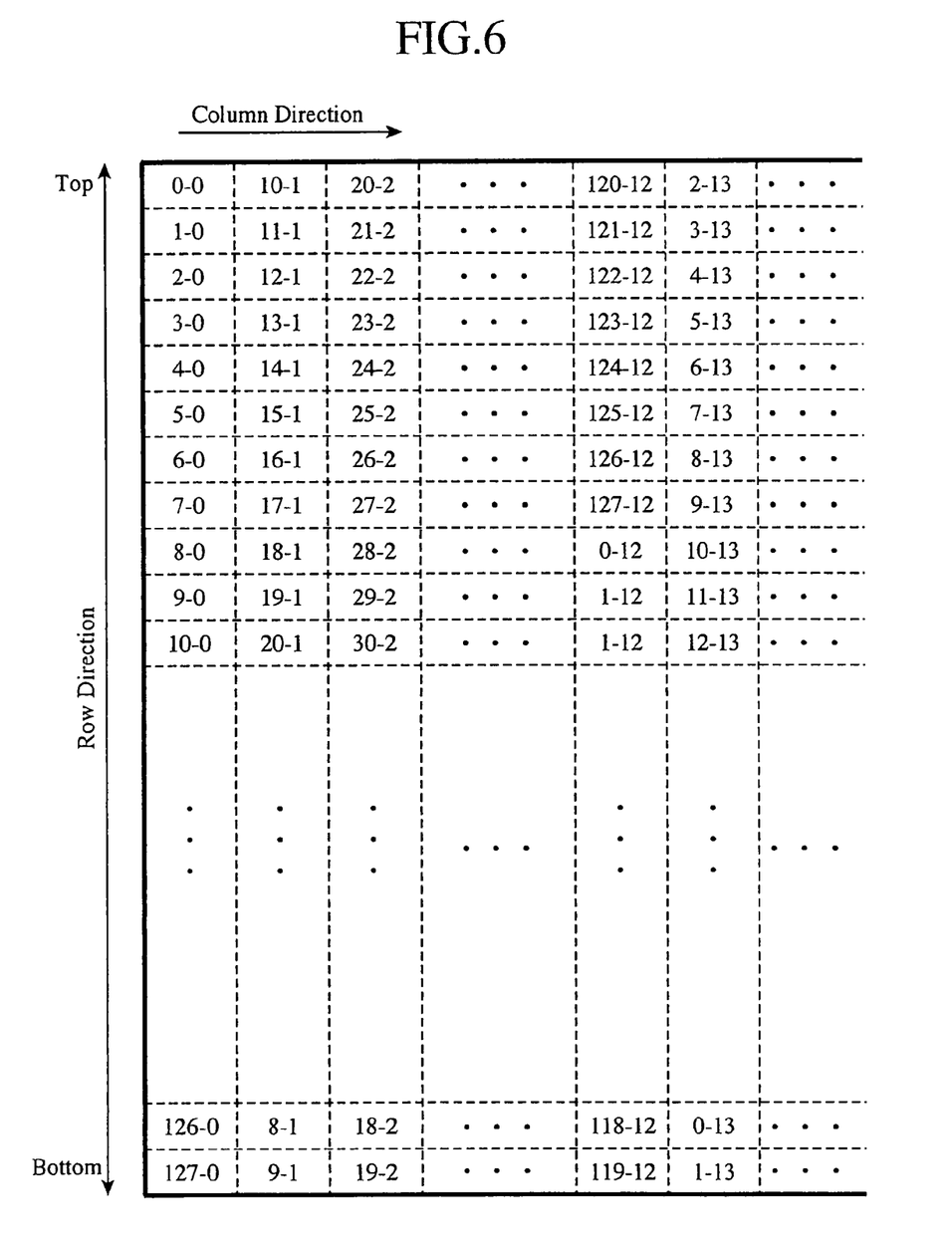
FIG. 6 is a diagram showing the order of pieces of information in the transmission information sequence in which the order of the pieces of information has been changed in accordance with embodiment 1 of the present invention.

FIG. 5 is a diagram showing the order of the pieces of information included in the transmission information sequences which has not changed by the first interleaving circuit 114. In the figure, "r-c" like 0-0 or 1-0, where r shows a row number and c shows a column number, denotes a reference symbol indicating the position of each piece of information in the OTU frame buffer. The first interleaving circuit 114 closes the input gate at every input time (for every column of the OTU frame buffer) and changes the order of the n parallel transmission information sequences without changing the order of the n parallel transmission information sequences at the time when they are inputted thereto (the time corresponding to each column of the OTU frame buffer). There can be provided various methods of changing the order for every column of the OTU frame buffer, and a method of carrying out a different bit shift for every column can be provided as an example. To be more specific, for example, the column number i of the OTU frame buffer is shifted by (i×s mod n) bits in the direction from bottom to top. In this case, s is arbitrary, but s=10 is preferable as an example. FIG. 6 is a diagram showing the order of the pieces of information in the OTU frame buffer which has been changed in this way.

After changing the order of the pieces of information in the OTU frame buffer, the first interleaving circuit 114 divides the n parallel transmission information sequences stored in the OTU frame buffer into n1 parallel data and n2 parallel data. n1 and n2 are natural numbers which satisfy n=n1+n2, and n1 is selected so that it can have a factor m1, and n2 is selected so that it can have a factor m2.

By doing in this way, the transmit side can use the factors m1 and m2 as the number of bits per one symbol of an error correction code for the n1 parallel data and that for the n2 parallel data, respectively. Particularly, because the transmit side can have a structure of selecting m1 and m2 from numbers which are not any factor of n, it can select, as m1 and m2, values which are slightly larger from the factors m of n. As a result, in spite of having a circuit structure which hardly changes as compared with the case in which a factor m of n is used as the bit number per one symbol of an error correction code, the transmit side can improve its correcting capability.

In the case of n=128, n1=40, n2=88, m1=10, and m2=11 can be provided as examples of such n1, m1, n2, and m2. When a method of selecting m1 and m2 in such a manner that at least one of m1 and m2 is not any factor of n is used, the advantage of the present invention is exhibited. That is, it can be understood that in the above-mentioned example, setting only m1 to 10 and setting m2 to 8 (the same bit number per one symbol of an error correction code as that according to the conventional technology) are sufficient for the case of n1=40 and n2=88. However, in this case, because $2^{m2}<N_R$, it is necessary to set up the code length $N_{R2}$ of the second block code independently so that $2^{m2}>N_{R2}$ is established.

In addition, from the viewpoint of the circuit scale, for the code length $N_R$ for the block coding processings performed by the first FEC coding circuit 115-1 and the second FEC coding circuit 115-2 which will be mentioned later, a minimum mr that satisfies $2^{mr}>N_R$ can be set as m1 or m2.

By carrying out the setting of m1 and m2 in this way, the transmit side offers the outstanding advantage of being able to improve its error correction capability without increasing the circuit scale thereof.

The order of the pieces of information included in the transmission information sequences is thus changed and the transmission information sequences are then divided into the two or more parallel data by the first interleaving circuit 114, so that they can be error-correction-coded by the first FEC coding circuit 115-1 and the second FEC coding circuit 115-2. The first FEC coding circuit 115-1 carries out the coding with a block code on a Galois field $GF(2^{m1})$, the block code having a code length $N_R$ and an information length $K_R$. On the other hand, the second FEC coding circuit 115-2 carries out the coding with a block code on a Galois field $GF(2^{m2})$, the block code having the code length $N_R$ and the information length $K_R$. n1/m1 processes are done in parallel in the coding processing by the first FEC coding circuit, whereas n2/m2 processes are done in parallel in the coding processing by the second FEC coding circuit. In the case of using the OTU frame buffer as shown in FIG. 3, $N_R=980$, $K_R=956$, n1/m1=4, and n2/m2=8. An RS (Reed-Solomon) code can be provided as an example of each of the block codes.

A parity symbol which is thus generated through the coding processing is stored in the first parity sequence region of the OTU frame buffer. After carrying out the above-mentioned processes, the first FEC coding circuit 115-1 and the second FEC coding circuit 115-2 output the coding results as n1 parallel first codeword sequences and n2 parallel second codeword sequences, respectively.

The first deinterleaving circuit 116 then combines the n1 parallel first codeword sequences outputted from the first FEC coding circuit 115-1 and the n2 parallel second codeword sequences outputted from the second FEC coding circuit 115-2 into n parallel third codeword sequences, and changes the order of the pieces of information included in the OTU frame buffer so that they have the same order as what they had before inputted to the first interleaving circuit 114. In this case, if the first interleaving circuit 114 has changed the order of the pieces of information using the method of shifting the column number i of the OTU frame buffer by (i×s mod n) bits in the direction from bottom to top, the first deinterleaving circuit has only to perform an operation which is the reverse of the above-mentioned shift operation, i.e., shift the column number of the OTU frame buffer by (i×s mod n) bits in the direction from top to bottom.

The third FEC coding circuit 117 divides the n parallel third codeword sequences in which the order of the pieces of information included has been returned to the original one by the first deinterleaving circuit 116 into groups each of which is a unit of $n_b$ parallel lines in a vertical direction and $N_B$ time slices in a horizontal direction, and codes each of the groups with a block code having, a code symbol, an element on a Galois field $GF(2^{mb})$, the element having a code length $N_B \times n_b/m_b$ and an information length $K_B \times n_b/m_b$. In this coding processing, $n/n_b$ processes are carried out in parallel. In the structure of the OTU frame buffer shown in FIG. 3, $N_B=1,020$, $K_B=980$, $m_b=1$, $n=128$, $n_b=1$, and $n/n_b=128$ can be established. As an example of the block codes, a BCH (Bose-Chaudhuri-Hocquenghem) code is used.

The third FEC coding circuit 117 stores a parity symbol which is generated in this way in the second parity sequence region of the OTU frame buffer. After carrying out the above-mentioned processes, the third FEC coding circuit outputs the results as n parallel fourth codeword sequences.

The first multiplexing circuit 118 converts the n parallel fourth codeword sequences which the third FEC coding circuit 117 has outputted into a serial codeword sequence, and transmits it to the first optical transmitter 23 as a fifth codeword sequence. The first optical transmitter 23 modulates this signal, and sends out it onto the optical communication path.

As mentioned above, in this FEC multiplexing circuit 22, the first interleave circuit 114 is disposed so as to divide n parallel information sequences into two or more parallel information sequences each of which has, as a factor, a bit number per one symbol of an error correction code which is required in order to acquire a desired error correction capability, and the FEC multiplexing circuit is so constructed as to perform error correction coding with an optimal bit number per one symbol on each parallel information sequence using an individual FEC coding circuit. Therefore, the FEC multiplexing circuit can acquire a higher error correction capability than before.

With such a structure, the range of choice of the bit number per one symbol of error correction coding which makes the FEC multiplexing circuit acquire a desired error correction capability can be widened. As a result, because the FEC multiplexing circuit can divide the parallel information sequences into two or more parallel information sequences whose parallel number has, a factor, a bit number per one symbol of an error correction code which is a minimum within the range which makes the FEC multiplexing circuit acquire a desired error correction capability, the error correction coding apparatus can be so constructed as to transmit a sufficiently-reliable signal to the optical transmission line even with a small circuit scale.

<The Operation of the Receive Side>

In the receive side, the second demultiplexing circuit 121 converts a quantized received sequence which the second optical receiver 25 has received into n' (n'=n×q) parallel quantized received sequences. From the n parallel quantized received sequences which this second demultiplexing circuit 121 has outputted, the frame synchronization circuit 122 detects overhead information added to the n parallel quantized received sequences so as to determine the top position of an OTU frame. The frame synchronization circuit 122 adds a frame synchronization signal to the n parallel quantized received sequences in order to transmit the OTU frame's detected top position to a circuit located at the backward stage, and outputs them to the circuit.

The third FEC decoding circuit 123 uses the frame synchronization signal so as to divide the n parallel quantized received sequences which the frame synchronization circuit 122 has outputted into two or more groups according to the FEC coding processing by the third FEC coding circuit 117 of the transmit side, and decodes them.

The quantization bit width per symbol transmitted varies dependently upon the decoding method. In the case of the quantization bit width q=1, the FEC decoding circuit carries out hard decision decoding. Therefore, the quantization bit width per symbol transmitted is set to 1. On the other hand, in the case in which q>1 and the FEC decoding circuit carries out soft decision decoding, the input bit width is q and the output bit width is q' (these widths are dependent upon the concrete decoding method). After carrying out the above-mentioned processes, the FEC decoding circuit outputs the results as n parallel first FEC decoding circuit output sequences (in the case of soft decision decoding, n×q' parallel first FEC decoding circuit output sequences).

The second interleaving circuit 124 changes the order of the pieces of information included in the n parallel first FEC decoding circuit output sequences which the third FEC decoding circuit 123 has outputted (in the case of the soft decision decoding, the n×q' parallel first FEC decoding circuit output sequences) by using the same method as what the first interleaving circuit 114 uses. Like the first interleaving circuit 114, the second interleaving circuit 124 divides the n parallel first FEC decoding circuit output sequences into n1 parallel data and n2 parallel data, and outputs them to the first FEC decoding circuit 125-1 and the second FEC decoding circuit 125-2, respectively.

The first FEC decoding circuit 125-1 decodes the n1 parallel sequences with a bit number m1 per one symbol of an error correction code, like the first FEC coding circuit 115-1, and the second FEC decoding circuit 125-2 decodes the n2 parallel sequences with a bit number m2 per one symbol of an error correction code, like the second FEC coding circuit 115-2. However, the quantization bit width per symbol transmitted varies dependently upon the decoding method. In the case of the quantization bit width q'=1 per symbol transmitted of the input sequence, they carry out hard decision decoding. Therefore, the bit width per symbol transmitted is 1, and the bit number per one codeword symbol is either m1 or m2.

The second deinterleaving circuit 126 combines the first estimated codeword sequences and the second estimated codeword sequences which are acquired through the decoding processings by the first FEC decoding circuit 125-1 and the second FEC decoding circuit 125-2 into n parallel estimated codeword sequences, and, after changing the order of the pieces of information included in the n parallel sequences so that they have the same order as what they had before inputted to the second interleaving circuit 124, outputs the results as third estimated codeword sequences. When the first and second FEC decoding circuits 125 carry out soft decision decoding, the second deinterleaving circuit judges whether the numerical value is positive or negative for every bit width q", converts the n parallel estimated codeword sequences into n parallel binary estimated codeword symbol sequences, and outputs the results as third estimated codeword sequences.

Next, the overhead separation circuit removes a bit corresponding to the overhead signal from the estimated codeword sequences outputted from the second deinterleaving circuit 126, and, after that, the second rate conversion circuit 128 separates and removes bits corresponding to the regions (the overhead region, and the first and second parity sequence regions) allocated by the first rate conversion circuit of the transmit side, performs an inverse rate conversion (($K_R$-f)/$N_B$ times) on the n parallel sequences, and outputs n parallel estimated information sequences.

Finally, the second multiplexing circuit 129 converts the n parallel estimated information sequences outputted from the second rate conversion circuit 128 into a serial estimated information sequence, and outputs it to the second optical transmitter 27.

As mentioned above, in this FEC demultiplexing circuit 26, the second interleave circuit 124 is disposed so as to divide n parallel information sequences into two or more parallel information sequences each of which has, as a factor, a bit number per one symbol of an error correction code which is required in order to acquire a desired error correction capability, and the FEC demultiplexing circuit is so constructed as to perform error correction coding with an optimal bit number per one symbol on each parallel information sequence using an individual FEC coding circuit. Therefore, the FEC demultiplexing circuit can acquire a higher error correction capability than before.

With such a structure, the range of choice of the bit number per one symbol of error correction coding which makes the FEC demultiplexing circuit acquire a desired error correction capability can be widened. As a result, because the FEC demultiplexing circuit can divide the parallel information sequences into two or more parallel information sequences whose parallel number has, a factor, a bit number per one symbol of an error correction code which is a minimum within the range which makes the FEC demultiplexing circuit acquire a desired error correction capability, the error correction decoding apparatus can be so constructed as to have an improved capability of making an error correction to a signal transmitted thereto via the optical transmission line even with a small circuit scale.

As mentioned above, because the error correction coding system and the error correction decoding system in accordance with embodiment 1 of the present invention can flexibly select a bit number per one symbol of an error correction code, even if the coding processing and the transmission processing are subject to constraints imposed by a specific frame format, error correction coding frames on which the error correction coding processing and interleaving are to be performed throughout plural FEC frames can be formed flexibly without being influenced by the constraints, and the capability of correcting random errors and burst errors can be improved.

In the above-mentioned structure, the case of n=128 is explained as an example of the parallel number n of input parallel sequences, though it is clear that even in a case in which another parallel number is adopted, if these error correction coding system and error correction decoding system are so constructed as above, they can flexibly select a bit number per one symbol of an error correction code.

Furthermore, in the error correction coding system and the error correction decoding system which are so constructed as above, then parallel input information sequences are divided into two parallel information sequences using natural numbers n1 and n2 which satisfy n=n1+n2. As an alternative, they can divide the n parallel input information sequences into a larger number of parallel information sequences.

Figure 7:
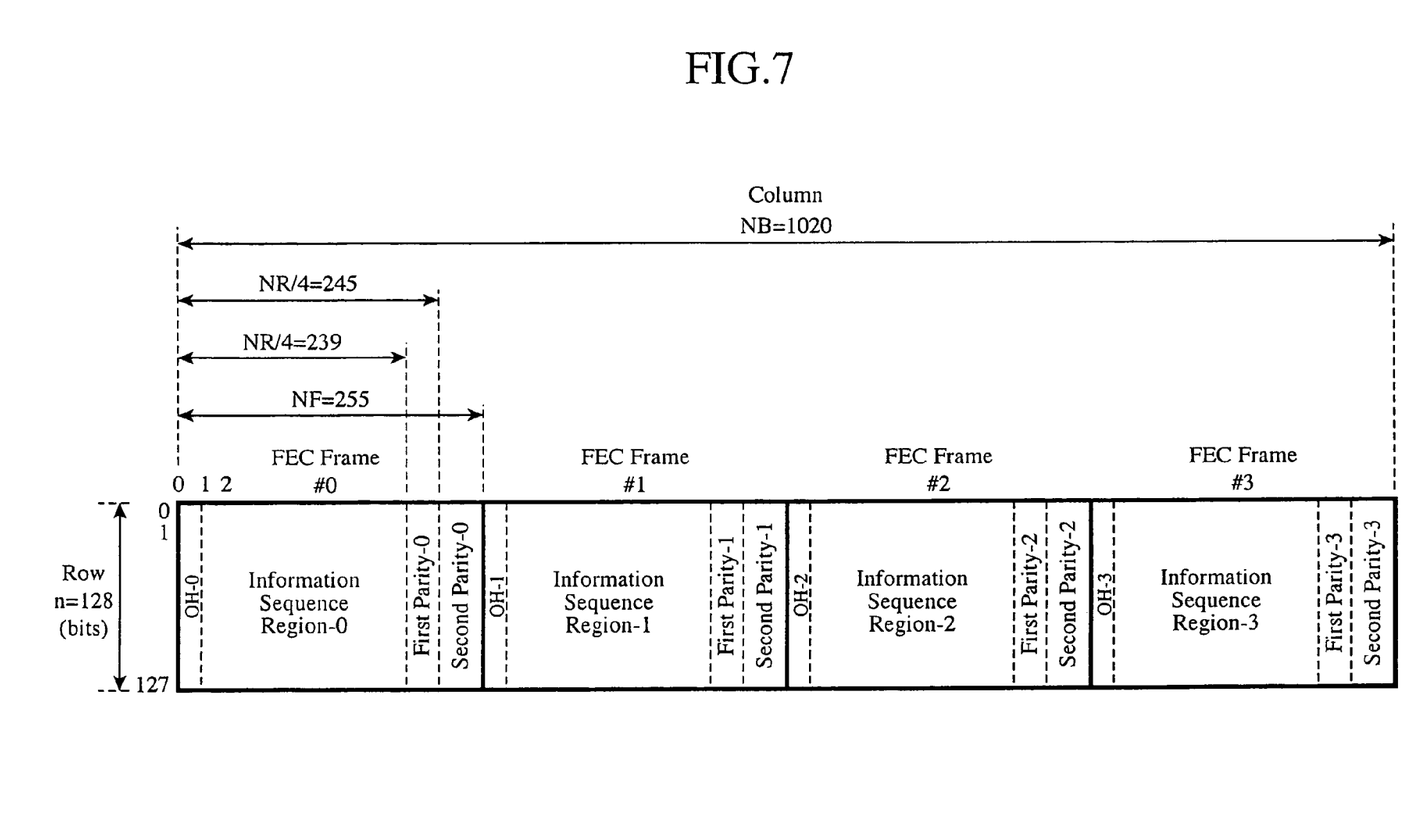
FIG. 7 is a block diagram showing the structure of another example of the working storage area in accordance with embodiment 1 of the present invention.

In order to facilitate the understanding of the above-mentioned structure, the working storage area, like the OTU frame buffer, is disposed, as previously explained. However, the use of a bus transfer can eliminate such a working storage area, as mentioned above. It is further clear that the error correction coding system and the error correction decoding system can also be applied to an FEC frame having the structure of the OTU frame buffer as shown in FIG. 3. That is, in the example of the OTU frame buffer of embodiment 1 shown in FIG. 3, allocation of regions within the OTU frame buffer is carried out in a different way for every FEC frame. However, a case in which allocation of regions within the OTU frame buffer is carried out in the same way for every FEC frame under the constraints on the communications system is assumed. When the structure of the OTU frame buffer shown in FIG. 3 is applied to an FEC frame as an example of a frame format which satisfies such a requirement, for example, the first parity sequence region and the second parity sequence region shown in FIG. 3 can be divided into four portions, and these four portions can be allocated to the right of the FEC frame. In this case, it is clear that the structures of the error correction coding system and the error correction decoding system can also be applied to such an FEC frame. FIG. 7 shows an example of the frame format in which the first parity sequence region and the second parity sequence region are divided into four portions and these four portions are allocated to the right of the FEC frame.

The FEC demultiplexing circuit 26 of FIG. 4 outputs the estimated information sequences generated from the first and second estimated codeword sequences which are the results of the decoding by the first FEC decoding circuit 125-1 and the second FEC decoding circuit 125-2. As an improvement of the method, the third estimated codeword sequences in which the order of the pieces of information included in each of the first and second estimation codeword sequences is changed is inputted again to the third FEC decoding circuit 123, and the third FEC decoding processing and then the first and second FEC decoding processings are iteratively carried out. Such iterative decoding raises the possibility of being able to correct the received sequences which cannot be corrected with the structure of FIG. 4. Therefore, the decoding error characteristics can be improved. Using this improved method, the bit width $q'''$ of the third estimated codeword sequences which are delivered to the third FEC decoding circuit can be changed according to the decoding method which is executed again by the third FEC decoding circuit. In the hard decision decoding $q'=1$, whereas in the soft decision decoding $q'''>1$.

In this embodiment 1 of the present invention, the features of the error correction coding/decoding method of the present invention are shown by taking a optical transmission system as an example. However, it can be easily understood that having such a structure as a optical transmission system is not de rigueur for the error correction coding/decoding method of the present invention in order to demonstrate its features, and this technical idea can be applied to general error correction coding using a block code.

Embodiment 2

In this embodiment 2 of the present invention, when a decoded result from a previous stage is delivered to a next stage decoding circuit in the error correction decoding process in accordance with embodiment 1 of the present invention, an error detection flag is set to a symbol of a non-binary code at a next stage containing a bit (referred to as an error detection bit from here on) corresponding to a codeword which was determined to be unable to be error-corrected at the time of the decoding circuit at the previous stage, and disappearance correction is carried out by the next stage decoding circuit using the error detection flag.

As an improvement of the above-mentioned method, there is provided a method of setting an error detection flag only when the number of error detection bits included in a symbol of a non-binary code is equal to or larger than a predetermined number b of bits. The setting of the error detection flag is done because the number of the same binary code bits (8 bits) included in each column of the frame and the bit number per one non-binary code symbol cannot be divided.

In accordance with embodiment 2, as mentioned above, when the demultiplexed received sequences are divided into groups each of which is a predetermined unit, and error correction decoding processing is carried out in parallel for every group, the predetermined units into which the demultiplexed received sequences are grouped differ in their being of at least two or more types, different error correction decoding processings according to the difference among the predetermined units into which the demultiplexed received sequences are grouped are carried out in parallel, two or more FEC decoding processings are carried out iteratedly, an error detection flag is set for a symbol in the decoding processing at the previous stage which corresponds to a symbol which has been error-detected by the next-stage decoding process means, and disappearance correction is carried out in the decoding processing at the backward stage. Therefore, even if the coding processing and the transmission processing are subject to constraints imposed by a specific frame format, by performing error correction coding processing and interleaving throughout plural FEC frames without being influenced by the constraints, the improved method of this embodiment can improve the capability of correcting random errors and burst errors.

INDUSTRIAL APPLICABILITY

As mentioned above, the error correction coding/decoding apparatus in accordance with the present invention is suitable for, for example, a cable-transmission apparatus using an error correction code which can form a flexible error-correction-coded frame without being influenced by the constraints imposed by the frame format, thereby improving the capability of correcting random errors and burst errors.

The invention claimed is:

1. An error correction coding apparatus which implements error correction coding for every predetermined number of frames and in a predetermined frame format, characterized in that said apparatus comprises:

a subframe division means for dividing transmission information sequences in n subframes (n is an arbitrary natural number) into n1 subframes (n1 is a natural number smaller than n) and n2 subframes (n2 is a natural number which satisfies n1+n2=n);

a first error correction code generating means for block-coding said n1 subframes for every m1 subframes (m1 is a factor of n1) so as to generate a first error correction code, and for adding the generated first error correction code as redundant information; and a second error correction code generating means for block-coding said n2 subframes for every m2 subframes (m2 is a factor of n2) so as to generate a second error correction code, and for adding the generated second error correction code as redundant information.

2. The error correction coding apparatus according to claim 1, characterized in that at least one of m1 and m2 is a natural number which is not any factor of n.

3. The error correction coding apparatus according to claim 1, characterized in that when a code length of block codes in both the first error correction code generating means and the second error correction code generating means is expressed as N, a minimum natural number mr which satisfies $2^{mr}>N$ is set as at least one of m1 and m2.

4. An error correction decoding apparatus which implements error correction decoding for every predetermined number of frames and in a predetermined frame format, characterized in that said apparatus comprises:

a subframe division means for dividing received sequences in n subframes (n is an arbitrary natural number) into n1 subframes (n1 is a natural number smaller than n) and n2 subframes (n2 is a natural number which satisfies n1+n2=n);

a first error correction decoding means for decoding said n1 subframes for every m1 subframes (m1 is a factor of n1) so as to output, as first estimated codeword sequences, decoded results; and a second error correction decoding means for decoding said n2 subframes for every m2 subframes (m2 is a factor of n2) so as to output, as second estimated codeword sequences, decoded results.

5. The error correction coding apparatus according to claim 4, characterized in that at least one of m1 and m2 is a natural number which is not any factor of n.

6. The error correction coding apparatus according to claim 4, characterized in that when a code length of block codes in both the first error correction code generating means and the second error correction code generating means is expressed as N, a minimum natural number mr which satisfies $2^{mr}>N$ is set as at least one of m1 and m2.

* * * * *